United States Patent [19]
Sartor et al.

[11] 4,455,207
[45] Jun. 19, 1984

[54] METHOD FOR METALLIZING CARBON FIBER REINFORCED PLASTIC MEMBERS

[75] Inventors: Bruno Sartor, Inden-Pier; Werner Jäger, Jülich; Horst Ebinger, Bad-Soden-Salmünster; Günther Luthardt, Rodenbach; Walter Bergmann, Hanau, all of Fed. Rep. of Germany

[73] Assignees: Uranit GmbH, Jülich; Nuken GmbH, Hanau, both of Fed. Rep. of Germany

[21] Appl. No.: 410,859

[22] Filed: Aug. 23, 1982

[30] Foreign Application Priority Data

Sep. 12, 1981 [DE] Fed. Rep. of Germany ....... 3136283

[51] Int. Cl.$^3$ .......................... C23C 15/00; B05D 3/06
[52] U.S. Cl. ................... 204/192 E; 427/40; 427/250; 427/290
[58] Field of Search ........................ 427/40, 290, 250; 204/192 E

[56] References Cited

PUBLICATIONS

Bunshah, R. F., *Physical Vapor Deposition of Metals, Alloys, and Ceramics*, In *New Trends in Materials Processing*, Metals Park, Ohio, American Society for Metals, 1976, pp. 200–219, 252–253.

Bayer Co., *Thermoplaste*, Technical Binder by Bayer, edition of Apr. 1, 1978, paragraph 4.5.3.

*Primary Examiner*—Evan K. Lawrence
*Attorney, Agent, or Firm*—Sughrue, Mion, Zinn, Macpeak & Seas

[57] ABSTRACT

A method for metallizing the surface of a carbon fiber reinforced plastic member by vapor-deposition of a metal layer in a high vacuum, with a glow treatment taking place before the vapor-deposition process. The surface of the plastic member to be metallized is removed until the carbon fibers lying closest to the surface are partially exposed. The plastic member is then degassed. A negative high voltage is applied across the degassed plastic member to bring about a glow treatment of the plastic member before the metal vapor-deposition. The glow treatment is continued into the initial phase of the metal vapor-deposition process.

6 Claims, 4 Drawing Figures

METHOD FOR METALLIZING CARBON FIBER REINFORCED PLASTIC MEMBERS

BACKGROUND OF THE INVENTION

The present invention relates to a method for metallizing the surface of carbon fiber reinforced plastic members by vapor-depositing a metal layer in a high vacuum, and effecting a glow treatment before the vapor deposition process.

Various types of vapor-deposition of substances onto a substrate are described in the publication entitled "New Trends in Materials Processing," published by the American Society for Metals, Metals Park, Ohio 44073 (1976), pages 200 et seq. According to this publication, vapor-deposition can be achieved by evaporation of the material to be vapor-deposited, by heating in a high vacuum, by ion-plating, or by sputtering.

In the informational publication entitled "Thermoplaste," in translation "Thermoplasts," Technical Binder by Bayer, Edition of Apr. 1, 1978, in paragraph 4.5.3, entitled, "Metallisieren von Durethan," in translation "Metallization of Durethan," the vapor-deposition of a metal layer in a high vacuum on molded pieces of the thermoplast Durethan is explained. (Durethan is a polyamide produced by Fa. Bayer, FRG). This publication discloses, inter alia, that the adhesion and quality of the vapor-deposited layer depends mainly on the adhesion of a primer or of preliminary and covering layers. But even if this pretreatment step is fully observed and a glow treatment is performed prior to the vapor deposition, adhesion of the vapor-deposited metal layer on the plastic surface is relatively poor.

SUMMARY OF THE PRESENT INVENTION

It is therefore an object of the present invention to improve the above-mentioned process in such a way that the vapor-deposited metal layers firmly adhere to the plastic member.

Additional objects and advantages of the present invention will be set forth in part in the description which follows and in part will be obvious from the description or can be learned by practice of the invention. The objects and advantages are achieved by means of the processes, instrumentalities and combinations particularly pointed out in the appended claims.

To achieve the foregoing objects and in accordance with its purpose, the present invention provides a method for metallizing the surface of a carbon fiber reinforced plastic member by vapor-deposition of a metal layer in a high vacuum, with a glow treatment taking place before the vapor-deposition process, comprising: first removing the surface of the plastic member to be metallized until the carbon fibers lying closest to the surface are partially exposed; then degassing the plastic member; applying a negative high voltage across the degassed plastic member to bring about a glow treatment of the plastic member before the metal vapor deposition; and continuing the glow treatment into the initial phase of the metal vapor-deposition process.

Preferably, the removal of material from the surface of the plastic member is effected by conducting an abrasive liquid, in the form of a liquid jet, over the surface of the plastic member.

It is to be understood that both the foregoing general description and the following detailed description are exemplary, but are not restrictive of the invention.

BRIEF DESCRIPTION OF THE DRAWINGS

The accompanying drawings, in which like numbers indicate like parts, illustrate an example of a presently preferred embodiment of the invention and, together with the description, serve to explain the principles of the invention.

Of the drawings.

DETAILED DESCRIPTION OF THE PRESENT INVENTION

Figure 1:
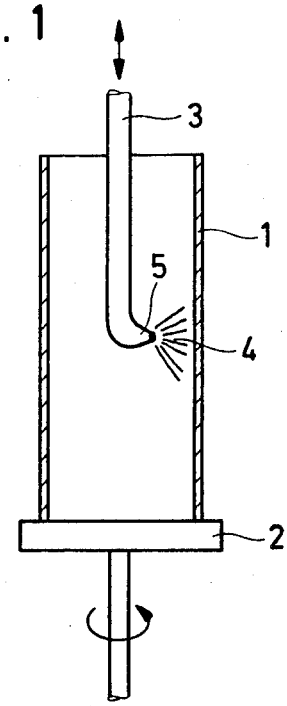
FIG. 1 shows one embodiment of an apparatus for removing the inner surface of a tubular component made of a plastic member being treated in accordance with the teachings of the present invention.

In the practice of the present invention, carbon fiber reinforced plastic members are metallized by vapor-deposition in a high vacuum. The plastic members generally are thermosetting materials with curing temperatures equal or higher than 100° C. The plastic members contain a plurality of carbon fibers in the range between 40 to 70 vol % which are electrically well conducting and which reinforce the plastic members.

In accordance with the present invention, the surface of the plastic member to be metallized is first treated by removing the surface until the carbon fibers lying closest to the surface are partially exposed. Preferably, this surface removal step is effected by an abrasive treatment of the surface. The abrasive treatment preferably is achieved by an abrasive liquid in the form of a liquid jet which is conducted over the surface of the plastic member.

The abrasive treatment exposes the electrically well conduction carbon fibers at the surface of the plastic member just enough so that they permit uniform development of the glow discharge before and during the initial phase of the vapor-deposition process but, on the other hand, leaves the carbon fibers sufficiently embedded in the plastic matrix so that they can not be easily dislodged and therefore remain permanently embedded. The layer thickness removed at the surface lies in the region of 2 to 10 $\mu$m. The abrasive treatment produces on the surface of the plastic member closely adjacent surface areas with very high electrical conductivity in the form of carbon fibers and surface areas with very low electrical conductivity in the form of synthetic resin areas which are disposed between the carbon fibers.

After the abrasive treatment, the plastic member then is degassed. Generally the degassing is effected at a temperature which is at most equal to the curing temperature which was used to set the synthetic resin. The degassing treatment can occur at a temperature which is slightly or somewhat below the curing temperature. Preferably, the degassing takes place at a temperature which is at most about 20° C. below the curing temperature. The degassing treatment removes the absorbed water from the plastic member and more volatile components which are in small quantities in the plastic member.

The degassed plastic member is then subjected to a glow treatment by applying a negative high voltage across the plastic member. This glow treatment is begun before the metal vapor deposition is started and effects a sputter cleaning of the surface of the plastic member by the gas ions which are produced in the glow discharge. The glow discharge is continued into the initial phase of the metal vapor deposition.

The negative high voltage used in the glow discharge simultaneously has the result that at the beginning of the vapor-deposition process, in addition to the gas ions formed by the glow discharge, metal ions impinge with high kinetic energy on the carbon fibers, as well as on the plastic matrix therebetween, and in this way the metal ions enter a firm and permanent bond with the carbon fibers as well as with the plastic.

As soon as the surface is sufficiently covered with the metal, i.e. 0.2 to 1.0 $\mu$m, the glow discharge is terminated and the vapor-deposition is continued in a high vacuum in the conventional manner until the desired layer thickness, e.g. 2 to 10 $\mu$m, has been obtained. Turning now to the drawings, FIGS. 1, 2a and 2b show a wet abrasive treatment of the inner surface of a tubular component made of a composite plastic material, comprising a carbon fiber reinforced synthetic resin mass (CFK).

Figure 2A:
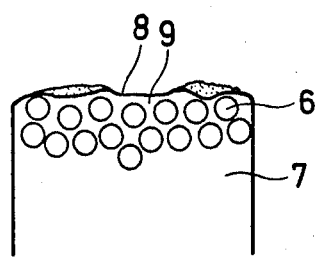
FIG. 2a shows a plastic member before it is treated in accordance with the process of the present invention.
Figure 2B:
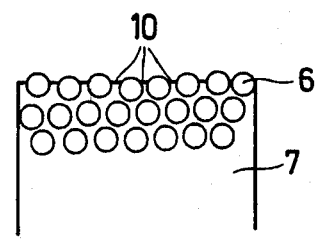
FIG. 2b shows a plastic member after it has been treated to remove the surface of the plastic member in accordance with the teachings of the present invention.

As seen in FIG. 1, a CFK pipe 1 to be treated is clamped vertically onto a turntable 2 and is rotated while being subjected to a liquid jet 4 which oscillates in the longitudinal axis of pipe 1 and exits from a hook-shaped nozzle 5 at an inlet 3 which can be moved up and down within pipe 1. The liquid includes an aqueous suspension which contains noble corundum ($\alpha$-Al$_2$O$_3$) of an average grain size of 45 $\mu$m as the abrasive blasting medium.

This abrasive treatment, which continues for several minutes, for example, 2 to 5 minutes, initially removes impurities, including mold releasing agent residues originating from the manufacture of the pipe. As a result of the abrasive treatment, the carbon (C) fibers disposed in the close vicinity of the surface are partially exposed. FIGS. 2a and 2b show schematically a microscopic section at the surface of pipe 1, made perpendicularly to the direction of the fibers, with FIG. 2a showing the surface of pipe 1 before the abrasive treatment and FIG. 2b showing the surface of pipe 1 after the abrasive treatment. As can be seen in FIG. 2a, the surface 8 of pipe 1 initially comprises a synthetic resin mass 9 which is free from carbon fibers 6 which are disposed entirely beneath the surface in a synthetic matrix 7. As shown in FIG. 2b, after the abrasive treatment, the microscopic area shows that there have been produced closely adjacent surface areas with very high electrical conductivity in the form of carbon fibers 6 and surface areas 10 with very low electrical conductivity in the form of synthetic resin mass areas disposed between carbon fibers 6. As shown in FIG. 2b, carbon fibers 6 alternate with surface areas 10.

After the wet abrasive treatment, CKF pipe 1 is degassed under vacuum at an increased temperature, that is, above room temperature. This degassing takes place over several hours at $10^{-4}$ to $10^{-6}$ millibar and at a temperature which is from approximately 20° C. below the curing temperature of the synthetic resin matrix to at most the curing temperature (e.g. 150° C.) of the synthetic resin matrix.

This degassing treatment removes once absorbed water from the composite plastic member. More significantly this degassing process removes more volatile components which are present in small quantities either already in the resin or in the setting agent, or which are present in the composite due to an incomplete reaction between resin and setting agent. The above-described degassing treatment assures that these annoying components which could be present under vapor-deposition conditions, are removed from the composite plastic substance beforehand.

Tests have shown that a slight reabsorption of water after the degassing treatment is not disadvantageous, so that the degassed CFK pipes can be stored for several days in a dry atmosphere such as nitrogen before the vapor-deposition treatment.

Figure 3:
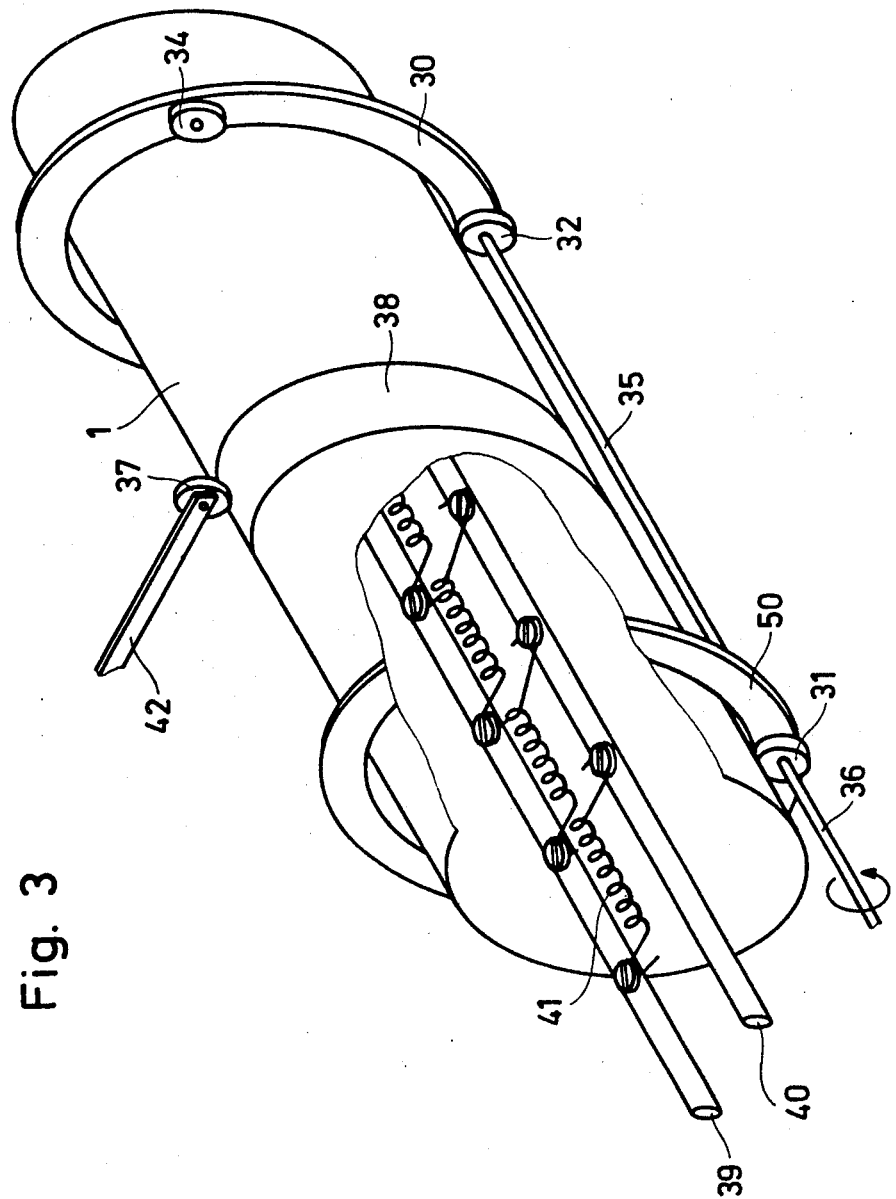
FIG. 3 shows one embodiment of an apparatus for metallizing the inner surface of a plastic member in the form of a pipe, and comprised of a carbon fiber reinforced synthetic resin mass, in accordance with the teachings of the present invention.

For the glow treatment and vapor-deposition process, CFK pipe 1 is placed into an apparatus which is disposed in a vacuum vessel (not shown) of a vacuum vapor-deposition system. This apparatus as illustrated in FIG. 3, essentially includes a first ring 30 and a second ring 50 which is spaced from ring 30. Ring 30 supports a drive roller 32 and two guide rollers 34, only one of which is shown in the drawings, and which preferably are equally spaced from each other and roller 32 around the circumference of ring 30. Similarly, ring 50 supports a drive roller 31 and two guide rollers (not shown) which preferably are equally spaced from each other and drive roller 31 around the circumference of ring 50. All six rollers are made of insulating material. Drive rollers 31 and 32 are connected to each other by a rigid shaft 35 which is driven, via a flexible shaft 36 and a vacuum rotary passage (not shown), by a motor disposed outside the vacuum vessel.

In the center of pipe 1 on the outside thereof, a roller 37 is placed onto pipe 1 to which a high voltage can be applied. In order to protect pipe 1 against damage from roller 37, a protective ring 38 of CFK material is placed at this point. Two current supply electrodes 39 and 40 are disposed in the interior of pipe 1 between which vapor-deposition helices 41 are clamped. These helices 41 are already wetted with the material to be vapor-deposited.

The vacuum vessel is initially evacuated to a high vacuum such as $10^{-5}$ mb. Then, a negative high voltage of about 2.5 KV is applied to CFK pipe 1 via a high voltage input 42, which is connected to roller 37 which contacts protective ring 38, while simultaneously argon is flowed into the vacuum vessel through a needle valve until it reaches a pressure of about $10^{-2}$ mb. A glow discharge is produced by the high voltage and argon flow. The glow discharge produces a sputter cleaning which cleans the pipe surface by subjecting the pipe surface to ion bombardment which atomizes and cleans it. The negative electrons fly to the two current supply electrode inputs 39 and 40.

During the last minute of the glow discharge, which takes about 5 minutes, vapor-deposition helices 41 are heated and the material disposed on the helices, e.g. aluminum, evaporates.

The still continuing glow treatment ionizes a fraction of the metallic vapor particles produced from helices 41 accelerates them toward the inner pipe surface, and causes them to partially penetrate the synthetic resin substrate. This partial penetration which is achieved due to the high kinetic energy of the metal ions is referred to herein as an "implantation effect," and explains the decisively improved adhesion compared to conventional vapor-deposition processes. To obtain a uniform layer thickness, pipe 1 is rotated during the vapor-deposition process. As soon as this implantation effect has produced a sufficient covering on the surface, the glow discharge is cut off for the further duration of the vapor-deposition process.

With the process according to the invention, adhesions of more than 20 N/mm$^2$, measured in head-on pulling tests, have been obtained with a metallic layer thickness of about 5 $\mu$m, compared to adhesion of less than 0.5 N/mm$^2$ in conventional vacuum vapor-deposition processes with comparable layer thicknesses.

It will be understood that the above description of the present invention is susceptible to various modifications, changes and adaptations, and the same are intended to be comprehended within the meaning and range of equivalents of the appended claims.

What is claimed is:

1. Method for metallizing the surface of a carbon fiber reinforced plastic member by vapor-deposition of a metal layer in a high vacuum, with a glow treatment in which there is a glow discharge taking place before the vapor-deposition process, comprising:
    (a) first removing the surface of the plastic member to be metallized until the carbon fibers lying closest to the surface are partially exposed enough to permit uniform development of the glow discharge, and sufficient to maintain the fibers permanently embedded in the plastic member;
    (b) then degassing the plastic member;
    (c) applying a negative high voltage across the degassed plastic member to bring about a glow treatment of the plastic member before the metal vapor deposition; and
    (d) continuing the glow treatment into the initial phase of the metal vapor-deposition process.

2. Method as defined in claim 1, wherein the removal of material according to step (a) is effected by conducting an abrasive liquid, in the form of a liquid jet, over the surface of the plastic member.

3. Method as defined in claim 1, wherein the plastic member is comprised of a thermosetting synthetic resin, and the degassing is effected at a temperature which is at most equal to the temperature at which the synthetic resin was cured.

4. Method as defined in claim 3, wherein the degassing is effected at a temperature which is below the curing temperature.

5. Method as defined in claim 3, wherein the degassing is effected at temperature which is between about 20° C. below the curing temperature and the curing temperature.

6. Method as defined in claim 1, wherein the glow treatment employs an inert gas and results in sputter cleaning of the plastic member with the positive ions of the gas.

* * * * *